United States Patent
Yu et al.

(10) Patent No.: US 11,404,385 B2
(45) Date of Patent: Aug. 2, 2022

(54) PACKAGED ELECTRONIC DEVICE WITH LOW RESISTANCE ROUGHENED BACKSIDE CONTACT

(71) Applicant: Texas Instruments Incorporated, Dallas, TX (US)

(72) Inventors: Qin Xu Yu, Chengdu (CN); Jian Jun Kong, Chengdu (CN); She Yu Tang, Chengdu (CN); Yun Fu An, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 65 days.

(21) Appl. No.: 16/840,705

(22) Filed: Apr. 6, 2020

(65) Prior Publication Data
US 2021/0159189 A1 May 27, 2021

(30) Foreign Application Priority Data
Nov. 21, 2019 (WO) ................ PCT/CN2019/119960

(51) Int. Cl.
*H01L 23/00* (2006.01)
*H01L 23/552* (2006.01)
(Continued)

(52) U.S. Cl.
CPC .......... *H01L 23/562* (2013.01); *H01L 21/304* (2013.01); *H01L 21/30604* (2013.01);
(Continued)

(58) Field of Classification Search
CPC ... H01L 23/562; H01L 23/552; H01L 21/304; H01L 21/30604; H01L 21/32051;
(Continued)

(56) References Cited

U.S. PATENT DOCUMENTS 8,179,678 B2 * 5/2012 Yamashita ............. H05K 9/006
361/715
8,822,814 B2 * 9/2014 Hayashi ............ H01L 31/02366
136/256
(Continued)

FOREIGN PATENT DOCUMENTS

| CN | 102403236 A | 4/2012 |
| CN | 104425274 A | 3/2015 |
| CN | 104576347 A | 4/2015 |

OTHER PUBLICATIONS

PCT International Search Report International, Application No. PCT/CN2019/11996, dated Nov. 21, 2019, 5 pages.

*Primary Examiner* — John P. Dulka
(74) *Attorney, Agent, or Firm* — Dawn Jos; Charles A. Brill; Frank D. Cimino

(57) ABSTRACT

In a described example, an electrical apparatus includes: a metal layer formed over a non-device side of a semiconductor device die, the semiconductor device die having devices formed on a device side of the semiconductor device die opposite the non-device side; a first side of the metal layer bonded to a die mount pad on a package substrate; a second side of the metal layer formed over a roughened surface on the non-device side of the semiconductor device die, the roughened surface having an average surface roughness (Ra) between 40 nm and 500 nm; bond pads on the semiconductor device die electrically coupled to conductive leads on the package substrate; and mold compound covering at least a portion of the semiconductor device die and at least a portion of the conductive leads.

20 Claims, 14 Drawing Sheets

(51) Int. Cl.
*H01L 21/304* (2006.01)
*H01L 21/306* (2006.01)
*H01L 21/3205* (2006.01)
*H01L 21/78* (2006.01)
*H01L 21/48* (2006.01)
*H01L 23/495* (2006.01)
*H01L 23/31* (2006.01)
*H01L 21/56* (2006.01)

(52) U.S. Cl.
CPC .... *H01L 21/32051* (2013.01); *H01L 21/4825* (2013.01); *H01L 21/565* (2013.01); *H01L 21/78* (2013.01); *H01L 23/3114* (2013.01); *H01L 23/4952* (2013.01); *H01L 23/49503* (2013.01); *H01L 23/49562* (2013.01); *H01L 23/552* (2013.01); *H01L 2223/5446* (2013.01)

(58) Field of Classification Search
CPC ................. H01L 21/78; H01L 21/4825; H01L 23/49562; H01L 23/3114; H01L 23/49503; H01L 23/4952; H01L 21/565; H01L 29/34; H01L 29/78; H01L 21/6835; H01L 24/97; H01L 23/3107; H01L 21/561; H01L 24/42; H01L 23/482
See application file for complete search history.

(56) References Cited

U.S. PATENT DOCUMENTS

| | | | |
|---|---|---|---|
| 9,786,849 B2 * | 10/2017 | Guimard | H01L 51/0096 |
| 9,793,456 B2 * | 10/2017 | Tozawa | C08G 77/54 |
| 9,984,712 B1 * | 5/2018 | Ozawa | G11B 5/70 |
| 10,048,150 B2 * | 8/2018 | Fuji | G01L 9/16 |
| 10,333,059 B2 * | 6/2019 | Swerts | H01L 43/12 |
| 10,408,896 B2 * | 9/2019 | Jamali | G01N 24/08 |
| 10,596,794 B2 * | 3/2020 | Moritz | C08J 7/043 |
| 2017/0130699 A1 | 5/2017 | Achilles et al. | |
| 2018/0191273 A1 | 7/2018 | Banfi et al. | |
| 2019/0326255 A1 | 10/2019 | Olson et al. | |

* cited by examiner

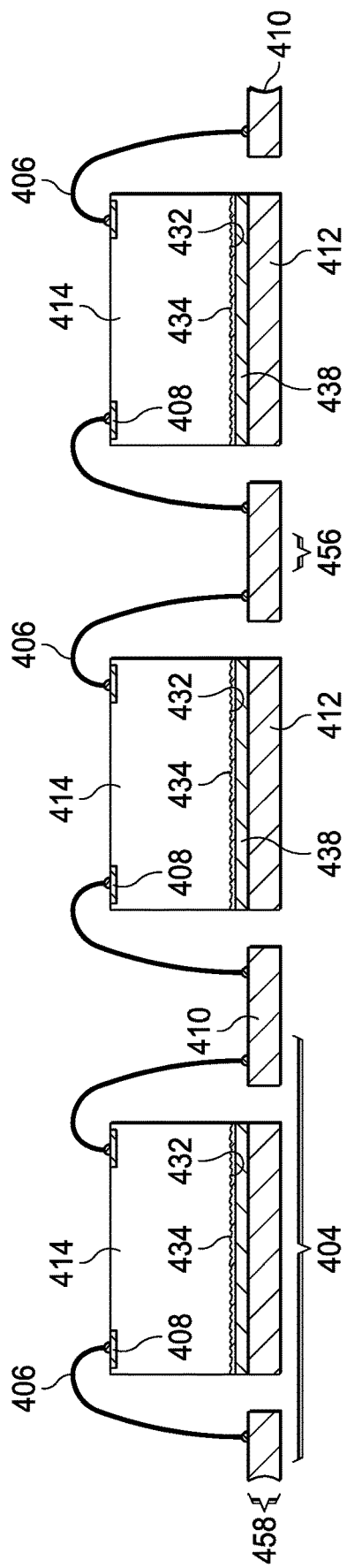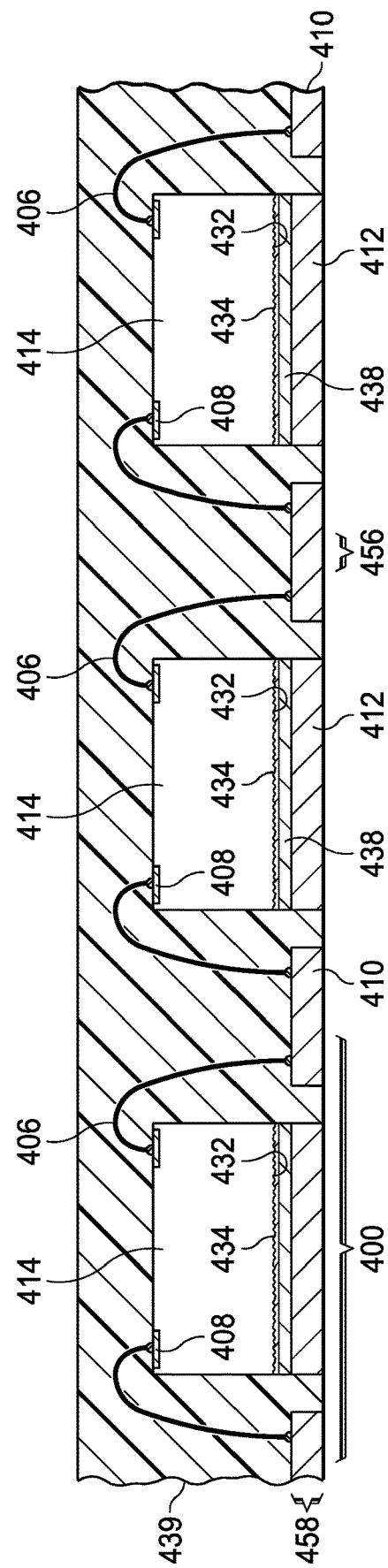

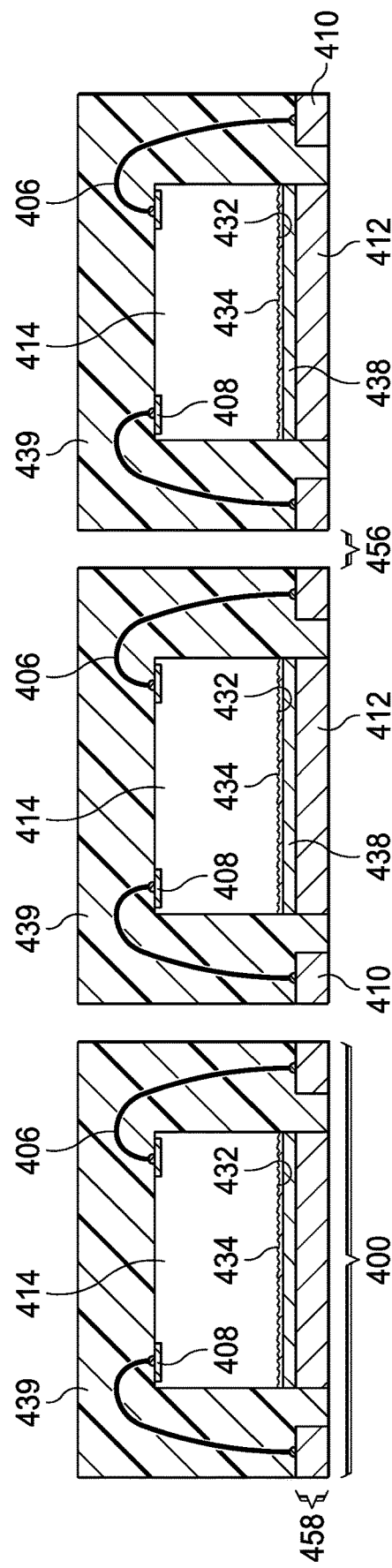
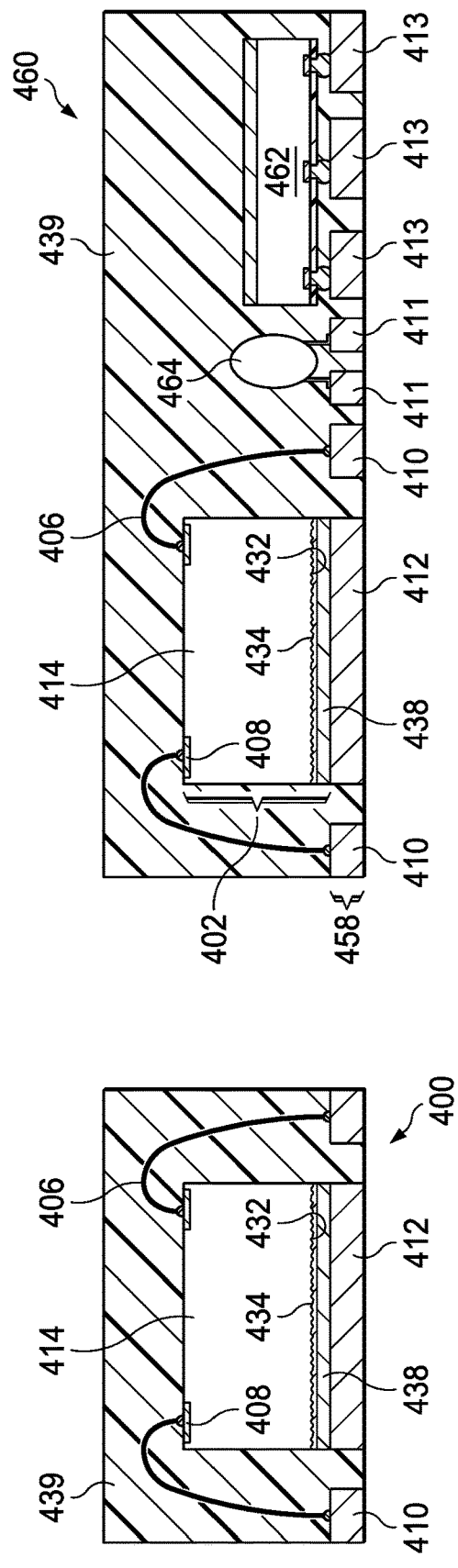
FIG. 4G
FIG. 4H
FIG. 4I

PACKAGED ELECTRONIC DEVICE WITH LOW RESISTANCE ROUGHENED BACKSIDE CONTACT

TECHNICAL FIELD

This disclosure relates generally to packaged electronic devices, and more particularly to packaged electronic devices with a backside contact.

SUMMARY

In a described example, an electrical apparatus includes: a metal layer with a thickness between 1.5 μms and 5.5 μms formed over a non-device side of a semiconductor device die on a semiconductor substrate, the semiconductor device die having devices formed on a device side of the semiconductor device die opposite the non-device side; a first side of the metal layer bonded to a die mount pad on a package substrate; a second side of the metal layer formed over a roughened surface on the non-device side of the semiconductor device die, the roughened surface having an average surface roughness (Ra) between 40 nm and 500 nm; bond pads on the semiconductor device die electrically coupled to conductive leads on the package substrate; and mold compound covering at least a portion of the semiconductor device die and at least a portion of the conductive leads.

BRIEF DESCRIPTION OF THE DRAWINGS

FIGS. 4C-4I are cross sectional views of the major steps to form packaged electronic devices including semiconductor device dies where the semiconductor device die has a roughened backside and thick metal on the backside.

DETAILED DESCRIPTION

Figure 1A:
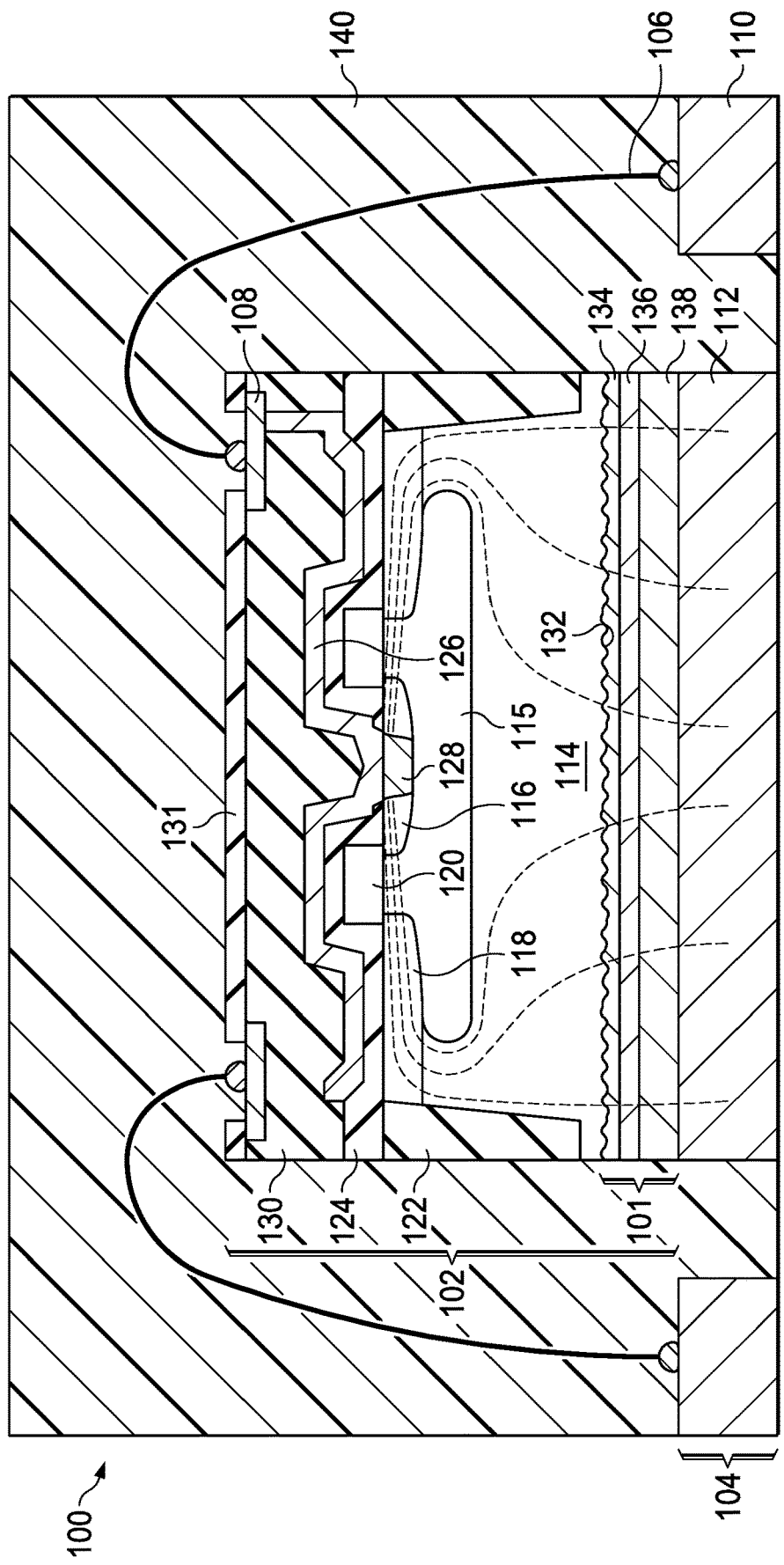
FIGS. 1A-1B are a cross sectional views of packaged electronic devices including semiconductor device dies with a roughened backside (non-device side) surface and having thick metal that forms a low resistance backside contact.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are also coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electromechanical system (MEMS) device, such as a digital micromirror device (DMD).

The term "power FET" is used herein. As used herein, a power FET is a transistor arranged to be used with a supply voltage between about 10V and 200V. The term "high voltage" is used herein to refer to voltages between about 10V and about 200V.

The term "packaged electronic device" is used herein. A packaged electronic device has at least one semiconductor device die electronically coupled to terminals and a package body that protects and covers the semiconductor device die. In some arrangements, multiple semiconductor device dies can be packaged together. For example, a power MOS semiconductor device die and a logic semiconductor device die such as a gate driver or controller device die can be packaged together to from a single packaged electronic device. Additional components such as passives can be included in the packaged electronic device. The semiconductor device die is mounted to a substrate that provides conductive leads, a portion of the conductive leads form the terminals for the packaged electronic device. The semiconductor device die can be mounted to the substrate with an active device surface facing away from the substrate and a backside surface facing and mounted to the substrate. Alternatively, the semiconductor device die can be mounted with the active surface facing the substrate surface and the semiconductor device die is mounted to the leads of the substrate by conductive columns or solder balls. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the substrate is not covered during encapsulation to provide the exposed terminals for the packaged electronic device.

The term "scribe lane" is used herein. A scribe lane is a portion of semiconductor wafer between semiconductor dies. Sometimes in related literature the term "scribe street" is used. Once processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "wafer level chip scale packaging" or "WCSP" is used herein. In WCSP, steps to complete a packaged semiconductor device are performed on the wafer prior to singulation. In an example of a bumped device, solder balls, solder bumps or column bumps are formed on bond pads of the semiconductor devices at the wafer level. After the wafer is bumped, the individual semiconductor dies are separated from the wafer using dicing and singulation steps. The bumped semiconductor dies can then be mounted to a substrate in a flip chip orientation.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements.

The term "package substrate" is used herein. A package substrate is a substrate arranged to receive a semiconductor die and to support the semiconductor die in a completed semiconductor package. Package substrates include conductive lead frames, which can be formed from copper, aluminum, steel and alloys such as Alloy 42 and copper alloy. The lead frames can include a die pad for mounting the semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound. Thermoset mold compound such as resin epoxy can be used. Transfer molding can be used, or block molding can be used, to form the package bodies from mold compound. After the molding, the individual packaged devices can be cut from the mold compound, exposed portions of the lead frame leads then form terminals for the packaged semiconductor device. Flip chip mounted devices can be used. In flip chip mounting, solder balls, solder columns, or solder bumps are formed on bond pads of the semiconductor die. The die is then oriented with the solder bumps facing a circuit board or substrate and a solder reflow process is used to attach the solder bumps to lands on the substrate, the solder forming a physical attachment and an electrical connection between the substrate and the semiconductor dies. Mold compound or other protective material can cover the die and a portion of the substrate to complete the flip chip package.

Alternative package substrates include pre-molded lead frames (PMLF) and molded interconnect substrates (MIS) for receiving semiconductor dies. These substrates can include dielectrics such as liquid crystal polymer (LCP) or mold compound and conductive portions in the dielectrics. The lead frames can include stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4.

A "thick metal" layer is described herein and is described as formed on a backside surface of a semiconductor substrate or wafer. As used herein, the term "thick metal" means a layer of metal that is at least 1.5 microns ($\mu$ms) and up to 5.5 $\mu$ms thick. The thick metal layer can be a single layer of metal or can be multiple layers of metal. In a particular example arrangement, the thick metal layer on the backside of a semiconductor wafer has multiple layers, and includes a titanium (Ti) layer over the semiconductor wafer for adhesion, a nickel (Ni) barrier layer over the titanium, and a thicker silver (Ag) layer over the nickel as the final and outermost layer. This thick metal layer has low resistance and is relatively low cost, and in a high voltage electronic device provides a contact with low resistance to a transistor, improving the on resistance ($R_{DS}$on) metric for the packaged devices. The arrangements can include other metal layers such as gold (Au), platinum (Pt), palladium (Pd), for example. Alloys and combinations of metals, and more or fewer barrier and diffusion layers can be used with a thick outermost metal layer to form additional arrangements.

The term "average surface roughness" is used herein. A measure of surface roughness, the measure of average surface roughness, Ra, is an average taken of a vertical distance to a peak in the profile of a surface measured from a base surface or ideal surface. As roughness increases, Ra for the surface also increases. The average Ra is an arithmetic mean calculated using samples along the profile for an evaluation distance. The average surface roughness Ra has units in distance. In this application a range of desired average surface roughness Ra is of a roughened surface is described from a minimum of about 40 nm to a maximum of about 500 nm. In contrast, a surface obtained by a wafer backgrinding operation, which smooths the surface, has an Ra of less than about 10 nm.

In this description, the term "roughened surface" is used. As used herein, a roughened surface is a surface that is treated to increase the average surface roughness Ra. In the examples, the roughened surface has an Ra that increases from an initial value of about 10 nm after a backgrinding operation to at least 40 nm, and can increase to up to 500 nm. The roughened surface improves performance as described herein.

In the arrangements, the problem of providing a low resistance contact to a semiconductor device die on a package substrate in a packaged electronic device is solved by providing a thick backside metal to lower resistance to the backside of the device die. The backside surface of a semiconductor wafer including the semiconductor device die is roughened prior to a metal deposition of the thick backside metal. Surprisingly, by roughening the backside surface after a wafer thinning backgrinding process smooths the surface, use of the arrangements prevents delamination of the thick backside metal.

FIG. 1A shows an example packaged electronic device 100 with a semiconductor device die 102 that has a low resistance backside (non-device side) contact to a package substrate 104. A packaged NexFET™ (a power MOS field effect transistor with vertical current flow available from Texas Instruments Incorporated) is used for illustration. Other packaged electronic devices such as bipolar transistors, high performance integrated circuits can also be used in the arrangements.

When the gate 120 of the NMOS NexFET™ 102 receives a potential that exceeds a threshold voltage and the device turns on, current flows from the heavily n-type doped source 116, laterally through the transistor channel under the gate 120 to a lightly n-type doped drain 118. The current then flows away from the topside (device side) of the NexFET™ semiconductor die 102 and out the backside (non-device side). The lightly n-type doped drain (LDD) 118 fully depletes when the transistor is off. The voltage drop across the fully depleted LDD 118 enables a low voltage transistor to switch high voltage. Thick metal layer (in an example, greater than or equal to 1.5 µm), 138, on the silicon substrate 114 backside of the NexFET™ provides a low resistance contact to the underlying package substrate die mount pad 112. The low resistance contact reduces series resistance and improves transistor performance. The thick metal, 138, can have significant stress and cause the thick metal 138 to delaminate from the silicon substrate 114.

Prior to depositing the thick backside metal 138, the surface of the silicon substrate 114, which is smoothed by backgrinding to thin the substrate, is roughened. In an example arrangement, the roughening is done using a special etching procedure. The roughened silicon surface 132 enhances adhesion between the thick metal 138 and the silicon substrate 114. The enhanced adhesion eliminates delamination of the thick metal layer, improves yield, improves performance, and improves reliability.

FIG. 1A shows a dual gate 120 NexFET™ 102 (an NMOS high power transistor in this example) where the transistor source 116 is on the frontside (device side) of the silicon substrate 114 and the transistor drain is the backside (non-device side) of the silicon substrate 114. During transistor operation, the transistor current flows vertically through the device die 102 from the frontside source 116 and out the backside of silicon substrate 114, which is the transistor drain. A source contact 128 shorts the n-type source diffusion 116 to the p-type transistor body 115. A first layer of interconnect 126 connects the source contact 128 to a frontside bondpad 108. Dielectric layer 124 prevents the interconnect 126 from shorting to the gate 120 and shorting to the lightly doped drain region (LDD) 118. Shallow trench isolation (STI) 122 (a trench filled with silicon dioxide dielectric) electrically isolates the NexFET™ transistor from other electrical devices (not shown) that can also be formed on the silicon substrate 114.

The backside (non-device side) surface 132 of the silicon substrate 114 is roughened after it is subjected to backgrinding, the backgrinding results in a smooth surface. In the arrangements the roughened backside surface has been found to enhance adhesion of and to prevent delamination of the thick backside metal 138. In an example arrangement, the backside metal is a tri-layer metal stack 101. In FIG. 1A, a first titanium layer 134 (with a thickness from 180 nm-220 nm) forms a silicide with the underlying roughened silicon substrate 114. Silicide formation lowers resistance and additionally increases adhesion (compared to silicon surfaces without silicide). The second layer 136 is nickel with a thickness from 180 nm-220 nm. The nickel layer improves solder wettability, and provides a diffusion barrier between the silicon substrate 114 and solder. In addition, the second nickel layer 136 provides protection for the underlying titanium layer 134 from mechanical scratching and corrosion. In an example, the thick metal layer 138 is a silver (Ag) layer with a thickness between 2700 nm and 3300 nm. In other examples a metal layer over the roughened surface has a thickness between 1500 nm and 5500 nm. The thick silver layer 138 prevents the underlying nickel layer 136 from oxidation and ensures excellent solder wettability, in addition to providing a low resistance contact to the underlying die mount pad 112 on the package substrate 104. The low resistance contact improves performance, especially for high voltage electronic devices.

The NexFET™ semiconductor device die 102 in FIG. 1A is mounted on die mount pad 112 of package substrate 104. Bondpads 108 on the surface of the interlevel oxide dielectric 130 (ILO) of the NexFET™ semiconductor device die 102 are electrically connected to leads 110 on substrate 104 with wire bonds 106. A protective overcoat layer (PO) 131 of a dielectric material such as silicon nitride or polyimide covers the surface of the ILO 130. Openings in the PO 131 layer expose the bond pads 108 to which the wire bonds 106 are connected. The NexFET™ die 102, the wire bonds 106, and a portion of the substrate 104 are covered with molding compound 140 to form a packaged electronic device 100. This packaged electronic device 100 can be referred to as "encapsulated", although the term "encapsulated" as used herein includes portions of the leads 110 that are exposed, and not covered by the molding compound 140, to form electrical terminals for the finished packaged device 100. The step of covering the device with mold compound 140 is sometimes referred to as an "encapsulation" process. As used herein, encapsulation includes partially covering the package substrate 104, so that portions of the leads 110 and the die mount area 112 may be exposed to provide electrical connection and to provide thermal conductivity between the packaged electronic device 100 and a system board or substrate.

Figure 1B:
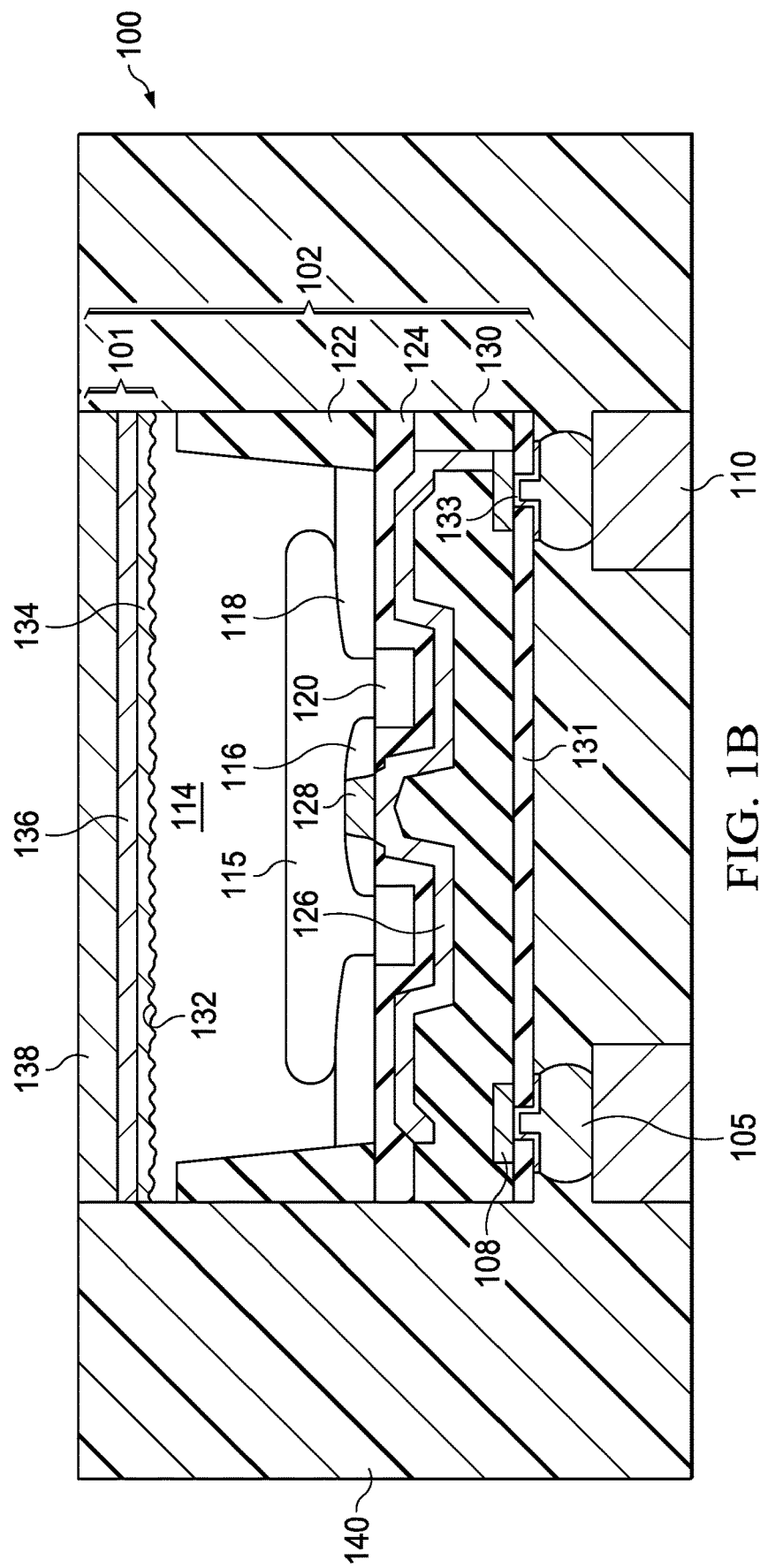

FIG. 1B illustrates in a cross sectional view an alternative arrangement for a flip chip packaged electronic device. The semiconductor die 102 in FIG. 1B has solder balls 105 formed on an under-bump metal (UBM) pad 133 that is in contact with the bond pad 108. The UBM can be nickel, nickel/palladium, nickel/gold, gold, silver or other solderable metal. The NexFET™ semiconductor die 102 with solder balls 105 is inverted and the solder balls 105 are melted to form solder bonds to the package substrate leads 110. (Flip chip ball bonding using a thermal reflow). The NexFET™ semiconductor die 102, the solder bonds, and a portion of the substrate leads 110 are covered with molding compound 140. Portions of the leads 110 and a portion of the thick metal layer 138 on the non-device side of the NexFET™ die 102 are exposed from the package body to make electrical terminals for the finished packaged electronic device 100.

FIGS. 2A-2H illustrate in a series of projection views the major steps in forming a low resistance, thick metal contact 238 on the backside (non-device side) of a semiconductor substrate 214. In FIGS. 2A-2H similar reference labels are used for similar elements as are shown in FIG. 1A, for clarity. For example, substrate 214 in FIGS. 2A-2H corresponds to silicon substrate 114 in FIG. 1A. Descriptions of the major steps in FIGS. 2A-2H are listed in the process flow diagram in FIG. 3.

Figure 2A:
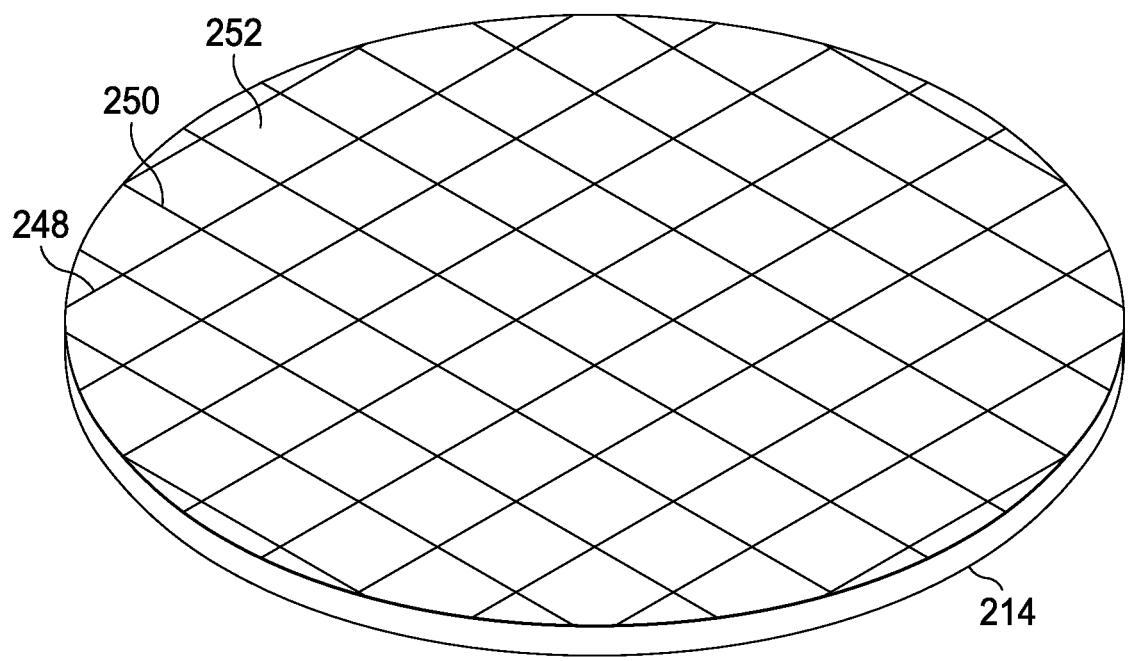
FIGS. 2A-2H are projection views illustrating major steps in the manufacturing of a low resistance backside contact on a semiconductor wafer.

FIG. 2A shows a semiconductor substrate 214 with the device side (frontside) facing up and the non-device side (backside) of the wafer facing down as oriented in FIG. 2A. Horizontal 248 and vertical 250 scribe lanes (shown horizontal and vertical as oriented in FIG. 2A, the lines are parallel and the two sets of the scribe lanes are perpendicular to each other) border each semiconductor device die 252 on the frontside of the substrate 214.

Figure 2B:
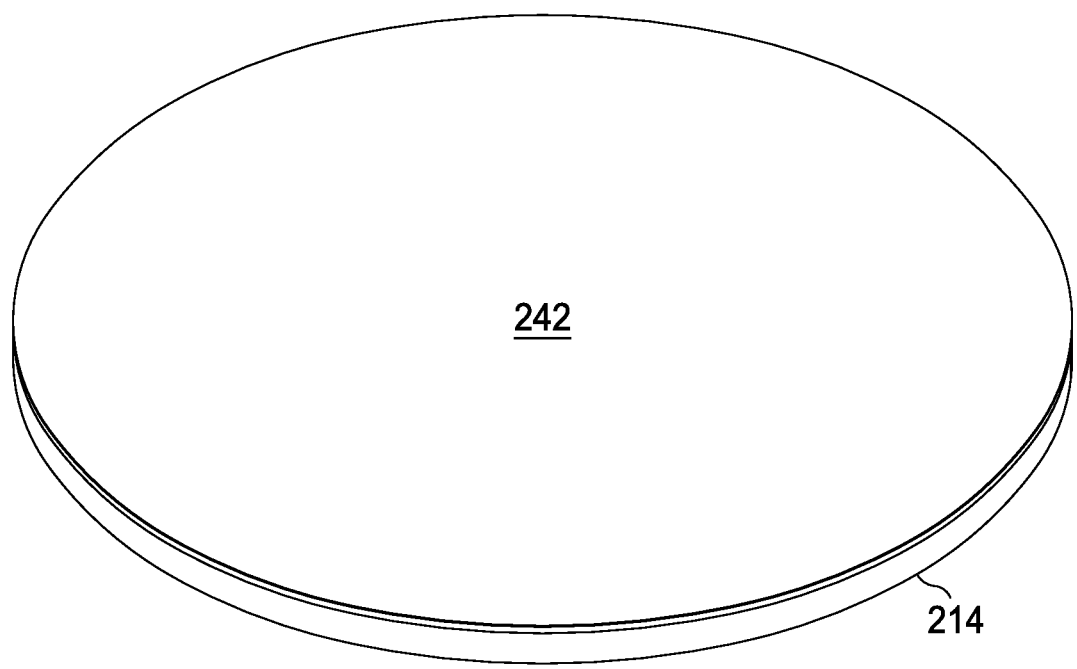

In FIG. 2B a backgrinding tape 242 (see step 301, FIG. 3) is applied to the frontside of the semiconductor substrate 214. Semiconductor substrate 214 can be, for example, a silicon wafer. Other semiconductor substrates can be used such as gallium arsenide (GaAs), silicon on insulator (SOI), silicon germanium (SiGe), gallium nitride (GaN), and other semiconductor materials can be used with the arrangements.

Figure 2C:
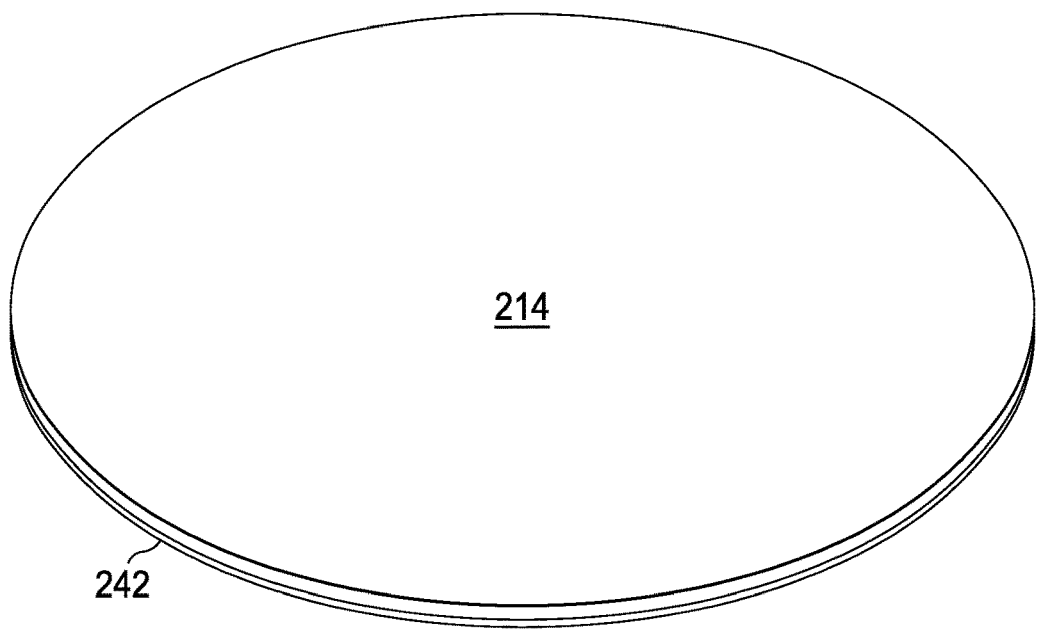

FIG. 2C shows the substrate 214 inverted with the device side facing down. Backgrinding (step 303, FIG. 3) is used to thin the substrate 214 from a thickness that can be more than 500 μm to a thickness of about 120 μm or less.

Figure 2D:
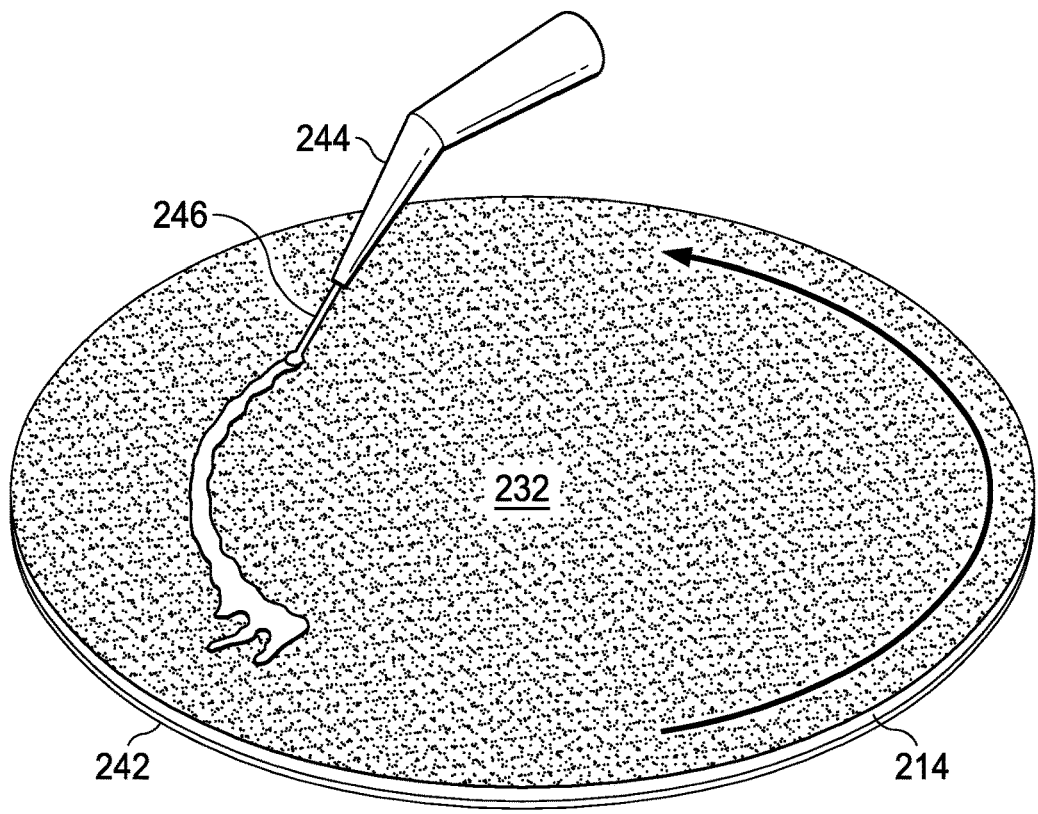

FIG. 2D (step 305, FIG. 3) illustrates a spin-etching step that enhances the roughness of the backside (non-device side) of the substrate 214, which has been smoothed by the wafer thinning process described above. In an example process, a series of three liquid mixtures are dispensed through a nozzle onto the backside surface of the spinning substrate 214, a wafer. In one example process, the liquids are dispensed at a rate of about 200 ml/min. or more. The spin speed can be modified to create additional arrangements. The spin speed of the wafer can be between about 300 rpm and about 600 rpm while the liquids are being dispensed.

In an example process, the liquid mixture dispensed during the etch first step is $H_2SO_4+HNO_3+HF$ (sulfuric acid/nitric acid/hydrofluoric acid). The concentration of the sulfuric acid is 75%-85%. The concentration of the nitric acid is 5-10%. The concentration of the hydrofluoric acid is 0.8%-5%. The remainder of the mixture is deionized (DI) water. The temperature of the first mixture is in the range of 30-60° C. The dispensing time is at least 10 seconds. The time and the concentrations of the acids can be varied.

After the first mixture, room temperature deionized water is dispensed onto the wafer for at least 3 seconds to clean the semiconductor substrate 214. In alternative approaches, other cleaning solutions can be used.

In the second step of the example roughening process, the second liquid mixture is $HNO_3+HF+H_2O_2$ (nitric acid, hydrofluoric acid, hydrogen peroxide). The concentration of $HNO_3$ in the second mixture is between 65%-70%. The concentration of HF in the second mixture is between 0.5%-1%. The remaining mixture is hydrogen peroxide ($H_2O_2$). In an example, the second mixture is dispensed for about 10 seconds at a temperature between 20° C. and 35° C. The time, temperature and acid concentrations of the second etch can be varied to form additional alternative processes that are contemplated as additional arrangements.

After the second mixture is applied, room temperature deionized water is dispensed onto the wafer for at least 3 seconds to clean the wafer.

In the third step of the example roughening process, dilute hydrofluoric acid (DHF) is dispensed onto the wafer, in an example the DHF is dispensed for about 10 seconds at a temperature between 25° C. and 50° C. The DHF is between 0.49%-3% hydrofluoric acid in DI wafer. As described above, the concentrations, temperatures, and dispensing times can be varied to form additional alternative processes.

After the third mixture is applied, DI water is dispensed onto the wafer for at least 3 seconds to clean the wafer. Other cleaning processes can be used to remove the etch acids from the wafer.

Following the DI wafer rinse, the spin speed of the wafer is increased to a speed greater than or equal to 1000 rpm under nitrogen ambient to remove excess liquid and to dry the semiconductor substrate 214. Other wafer drying processes can be used.

Figure 2E:
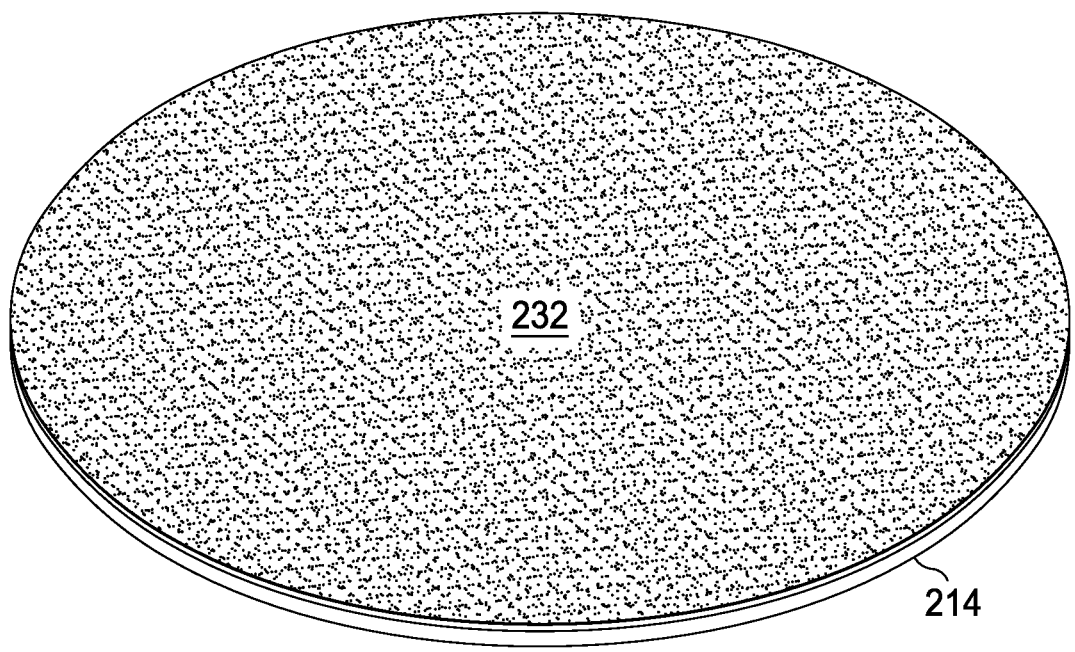

FIG. 2E, shows the non-device side (backside) of the wafer with the roughened surface 232. The 3-step spin-etch increases the average surface roughness (Ra) from about 10 nm post backgrind to greater than about 40 nm post spin-etch. The average surface roughness post spin-etch can be between about 40 nm and 500 nm. The backgrind tape 242 is then removed (step 307, FIG. 3).

Figure 2F:
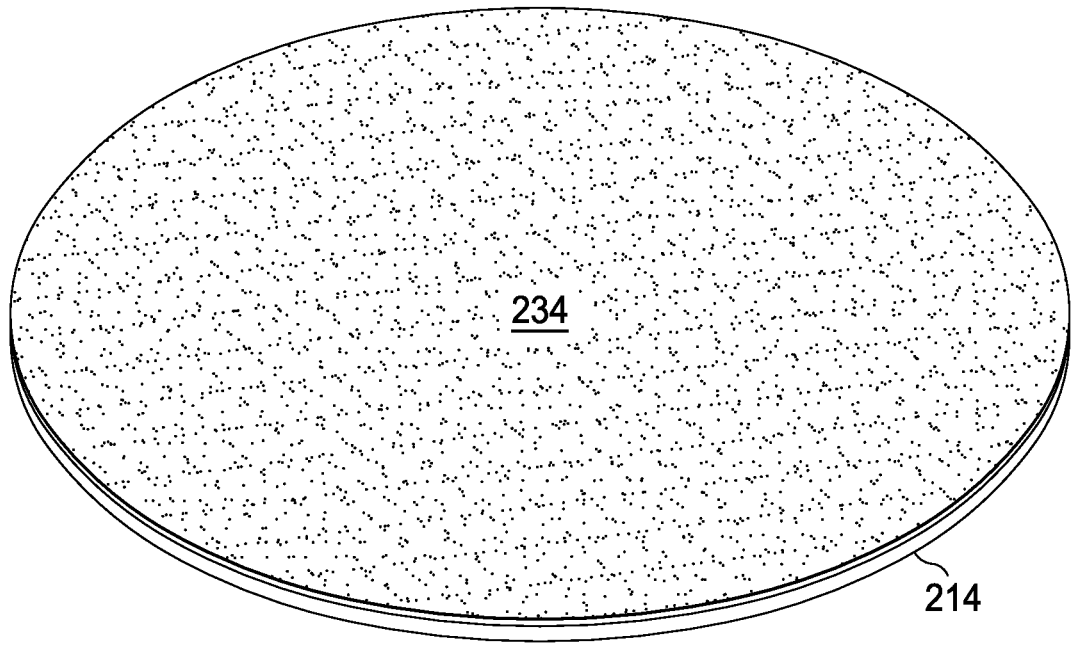

In FIG. 2F, after a wafer clean (step 309, FIG. 3) a first layer 234 of backside metal is deposited (step 311, FIG. 3) to provide low contact resistance and to provide improved adhesion. In one application, a titanium layer with a thickness between about 100 nm and 220 nm is deposited. The titanium layer forms a silicide with the roughened surface 232 of silicon substrate 214. This provides a low resistance contact to the underlying silicon substrate 214 and provides excellent adhesion for subsequent metal layers.

In FIG. 2F (step 313, FIG. 3) a barrier metal 236 is deposited on the first layer 234 of metal to prevent interdiffusion of the thick metal 238 with the underlaying silicon substrate 214. In one application a nickel layer with a thickness between 180 nm and 400 nm is deposited. The nickel layer 236 is solderable and provides a diffusion barrier between solder to be applied in mounting the die and the silicon substrate 214.

Figure 2G:
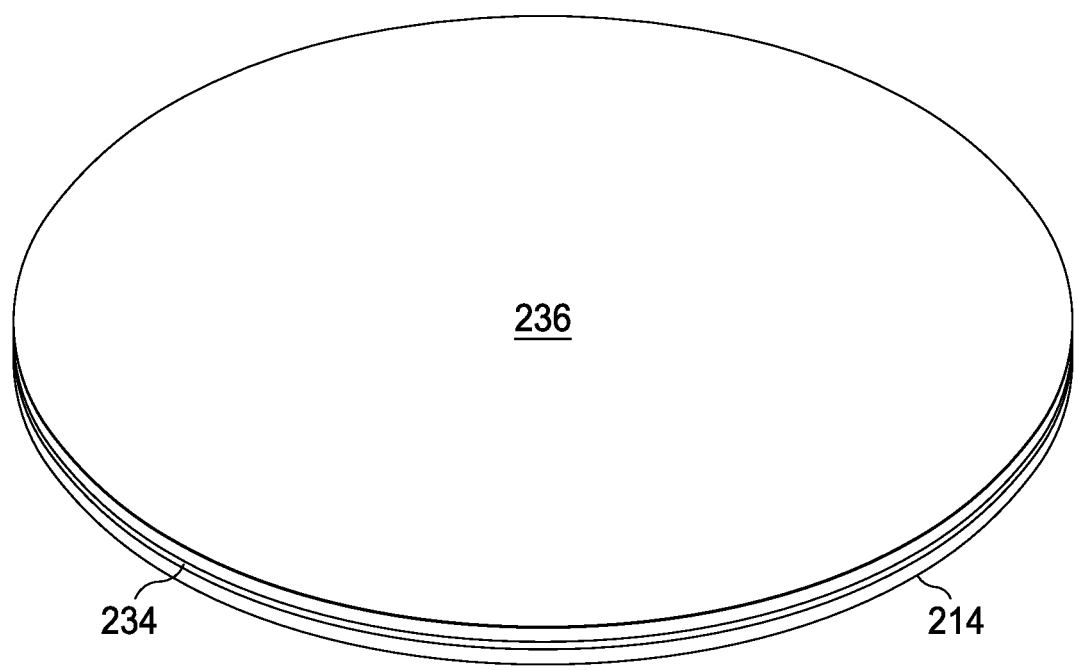
Figure 2H:
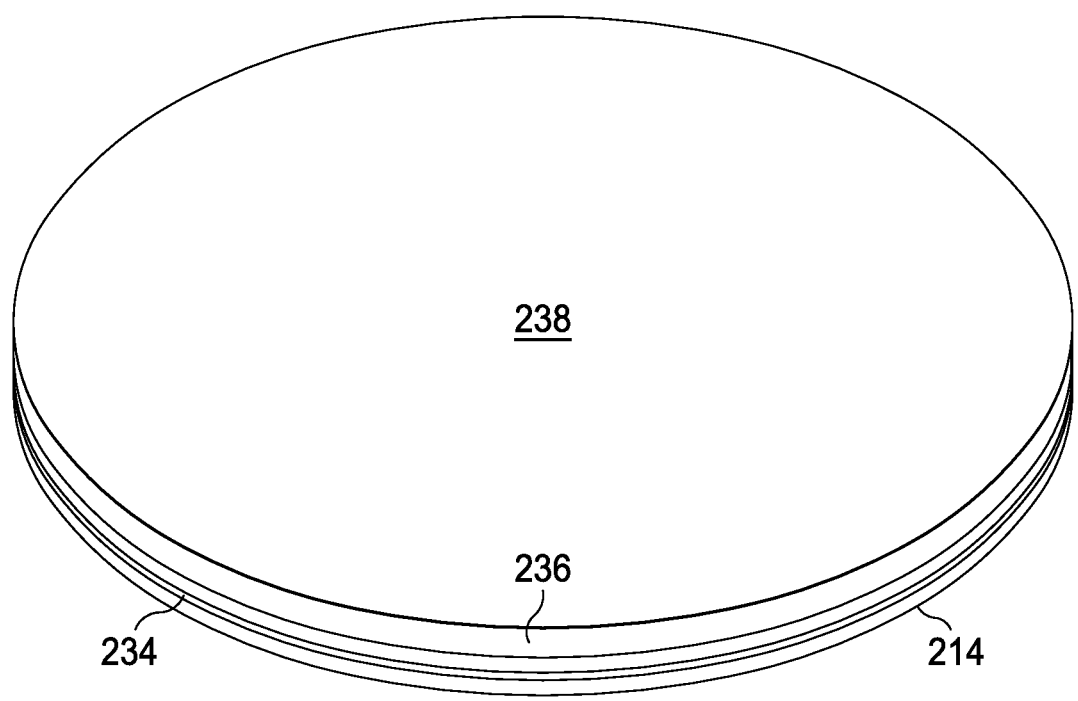

In FIG. 2G (step 315, FIG. 3) thick metal 238 is deposited onto the non-device side (backside) of the wafer 215. In one application the thick metal 238 is silver (Ag) with a thickness in the range of 1.5 μm to 5.5 μm. The silver layer 238 provides excellent solder wettability and provides low resistance for the backside (non-device side) contact. The silver layer 238 also prevents the underlying nickel 236 from oxidation prior to soldering.

These metal layers 234, 236, and 238 can be deposited using a physical vapor deposition technique such as evaporation or sputtering. Evaporation is the preferred method because of the higher deposition rate.

Other adhesion/barrier metals such as titanium/titanium nitride, titanium/nickel-vanadium alloy, and tantalum/tantalum nitride may be used for the adhesion and/or barrier layers. Other thick metals such as gold, palladium, platinum and copper can also be used to provide low resistance. The use of the titanium, nickel and silver provides a low contact resistance at relatively low costs, however other materials can be used to form additional arrangements.

After depositing the metal layers 234, 236, and 238, the wafer 214 can be annealed at a temperature of about 400° C. and for a time of about 30 minutes to sinter the metal. Variations in time and temperature for the anneal and sintering can form additional alternative arrangements.

The major manufacturing steps for packaging an electronic device including a semiconductor device die with a low resistance, non-device side contact to a substrate such as a lead frame, PMLF, or MIS substrate, is illustrated in cross sectional views and projection views in FIGS. 4A-4I. In FIGS. 4A-4I similar reference labels are used for similar elements as are shown in FIG. 2A-2H for clarity. For example, semiconductor substrate 414 in FIGS. 4A-4I corresponds to semiconductor substrate 214 in FIGS. 2A-2H. Descriptions of the major steps in FIGS. 4A-4H are listed in the process flow diagram in FIG. 5.

Figure 4B:
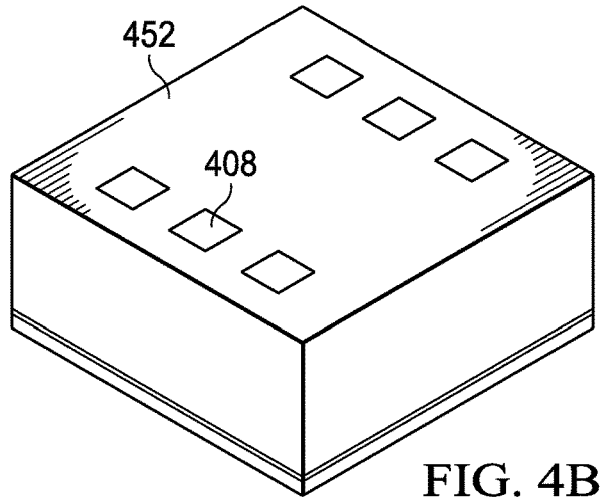
FIGS. 4A-4B are a projection view and a close up of a semiconductor wafer and a die.
Figure 4A:
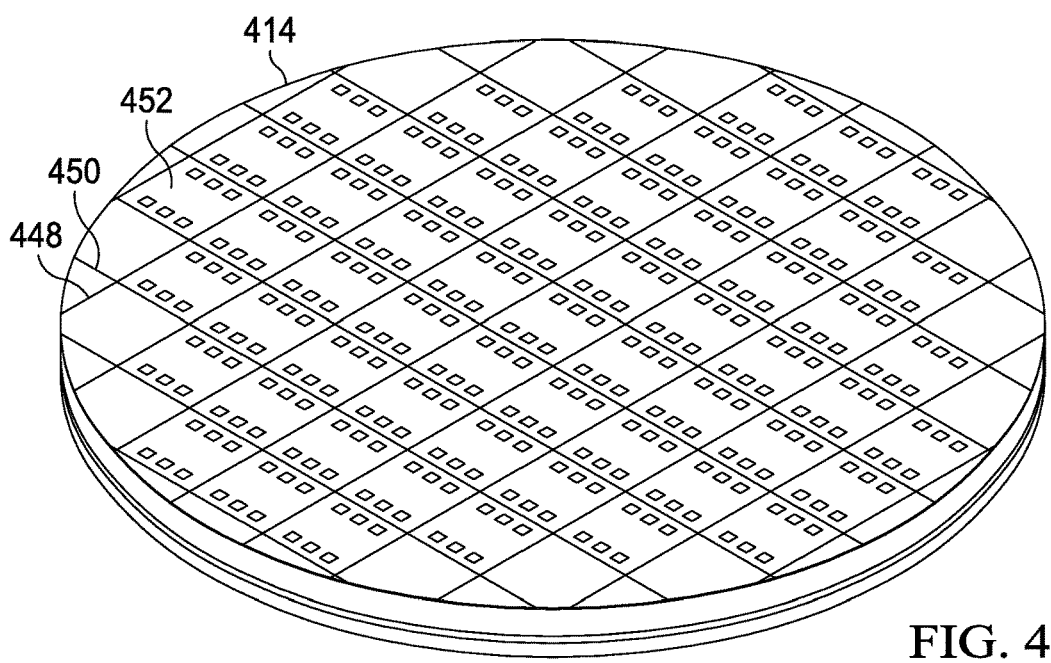

FIG. 4A shows a projection view of a semiconductor substrate 414 such as a wafer with a device side covered with semiconductor device dies 452. Horizontal scribe lanes 448 (as portrayed in FIG. 4A) and vertical scribe lanes 450 separate each die 452 from adjacent dies.

Figure 5:
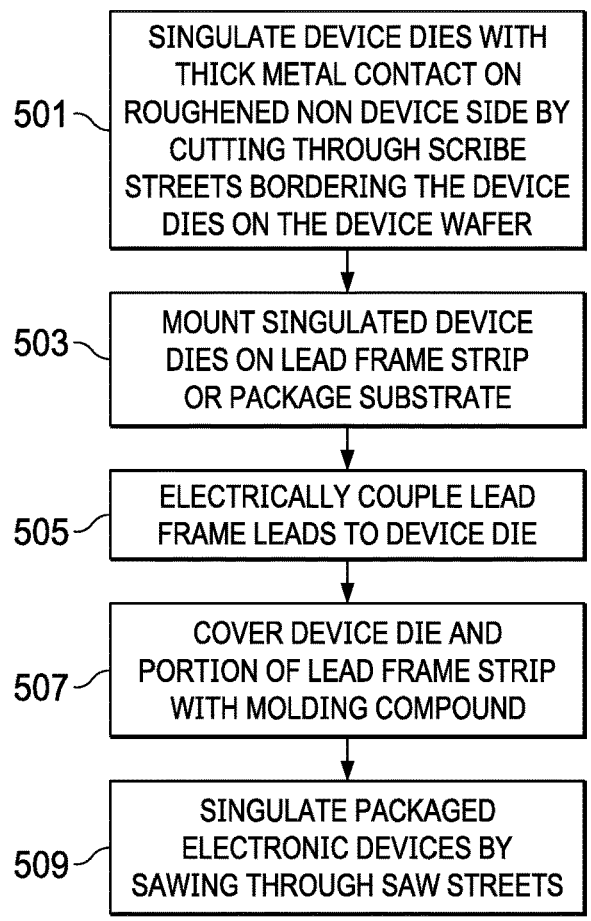
FIG. 5 is a flow diagram with descriptions of the manufacturing steps in FIGS. 4A-4H.

The semiconductor device dies 452 are singulated by cutting through the wafer along the horizontal 448 and vertical 450 scribe lanes (see step 501, FIG. 5). FIG. 4B is an expanded view of one of the singulated dies 452 with bondpads 408 shown on the active (frontside) surface. Not shown but present on the wafer 414 are, for example, semiconductor devices such as transistors, integrated circuits, diodes, resistors, inductors, coils, capacitors and other circuit types that can be formed in a semiconductor device.

Figure 4C:
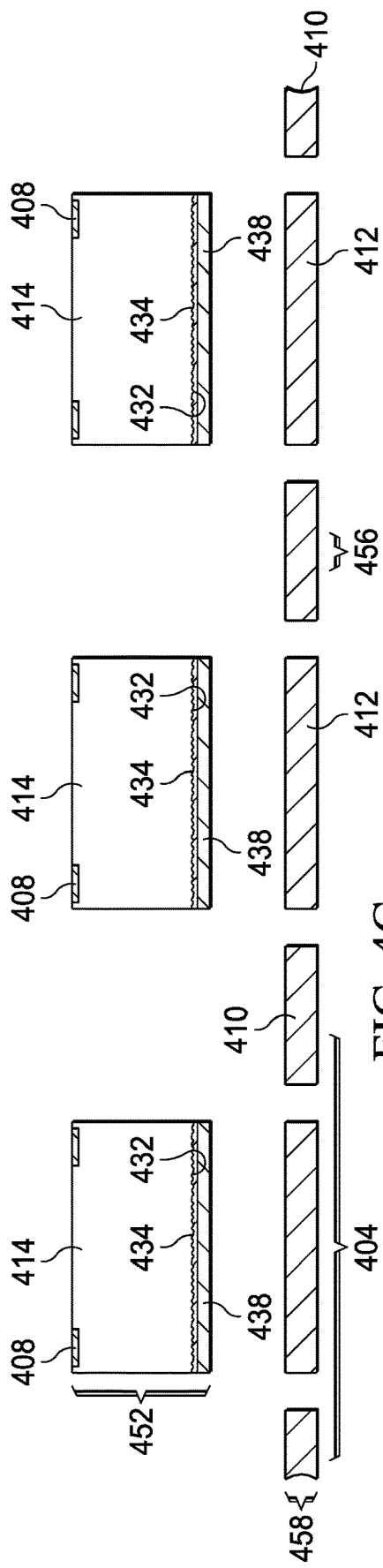

In FIG. 4C, singulated semiconductor device dies 452 are shown in a cross sectional view being aligned to a die mount pad 412 on a package substrate 458. In this application the package substrate 458 is a lead frame strip, but the package substrate 458 can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4. The package substrate 458 in this example is a lead frame strip that is several individual lead frames 404 (die mount pad 412 plus leads 410) joined together by saw streets 456 made of lead frame material. Lead frames can also include removable portions (not shown) that mechanically support the leads 410 prior to mounting the semiconductor device dies and encapsulation, these portions are trimmed away during the packaging processes to electrically isolate the leads from one another.

Figure 4D:
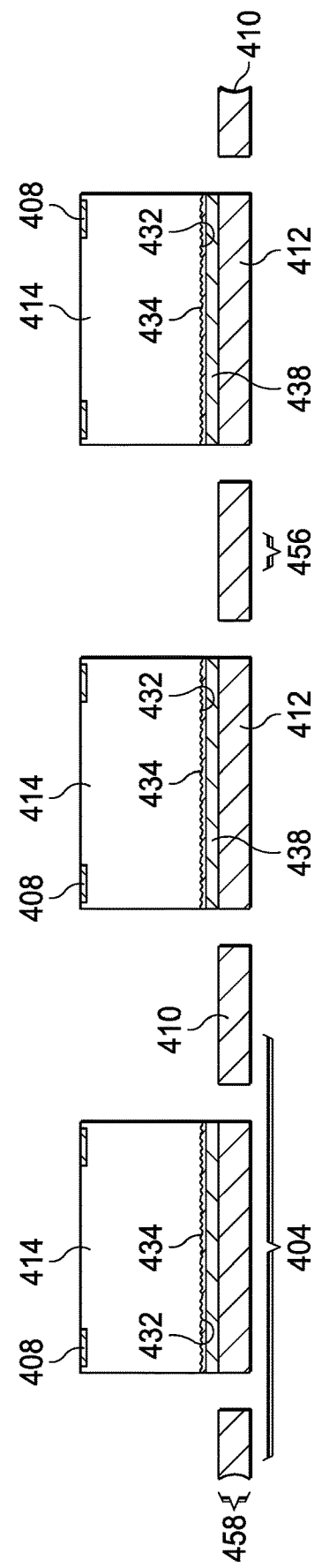

In FIG. 4D, another cross sectional view shows the singulated dies 452 (step 503) are mounted on the die mount pad 412 using a bonding agent such as solder or an adhesive. Some adhesives for die mounting are referred to as "die attach" and these can be used. Die attach for the arrangements can be thermally conductive.

In FIG. 4E, in another cross sectional view, bond pads 408 on the dies 452 are electrically connected to leads 410 on the lead frame strip 458 with conductors 406 (see step 505 in FIG. 5). In FIG. 4E the conductors 406 are wire bonds. Ribbon bonds or other conductive connectors can be used.

In FIG. 4F, the dies 452, the conductors 406, and portions of the lead frame leads 410 are shown covered with a mold compound 439 such as a filled epoxy, (see step 507 in FIG. 5). The mold compound can be subjected to a thermal cure or can be a thermoset mold compound, heated and dispensed in a mold as a heated liquid that cures and solidifies as it cools.

In FIG. 4G, a cross sectional view shows individual packaged semiconductor device dies 400 that are singulated (step 509) from one another by cutting through the saw streets 456 on the lead frame strip 458.

FIG. 4H is a cross section view of one singulated packaged electronic device 400 in which the semiconductor device die has a low resistance backside (non-device side) contact to the lead frame die mount pad 412. The low resistance contact is achieved by depositing a thick, low resistance metal 438 on the backside (non-device side) of the electronic device die. Delamination that can be caused by the stress of the thick, low resistance metal 438 is avoided by forming a roughened backside surface 432 on the silicon substrate 414 prior to deposition of the thick metal 438. The roughened backside surface 432 increases adhesion between the silicon substrate 414 and the thick backside metal made of metal layers 434, 436, and 438.

FIG. 4I illustrates a multi-chip module (MCM) arrangement 460 in which several electrical devices in addition to the NexFET™ 402 are bonded to leads 410, 411, 412 413 on the same package substrate 458. For example, in FIG. I the NexFET™ 402 is bonded to leads 411 and 412, a capacitor is bonded to leads 411, and another semiconductor device die 462 is flip chip bonded to leads 413. Other electrical devices and integrated circuit dies can be bonded to the multi-chip module substrate 458. The dies 462, 402 and electrical devices 464 can be mounted on the package substrate 458 using a variety of methods such as wire bonds, ribbon bonds, ball bonds, and conductive adhesives.

Figure 4J:
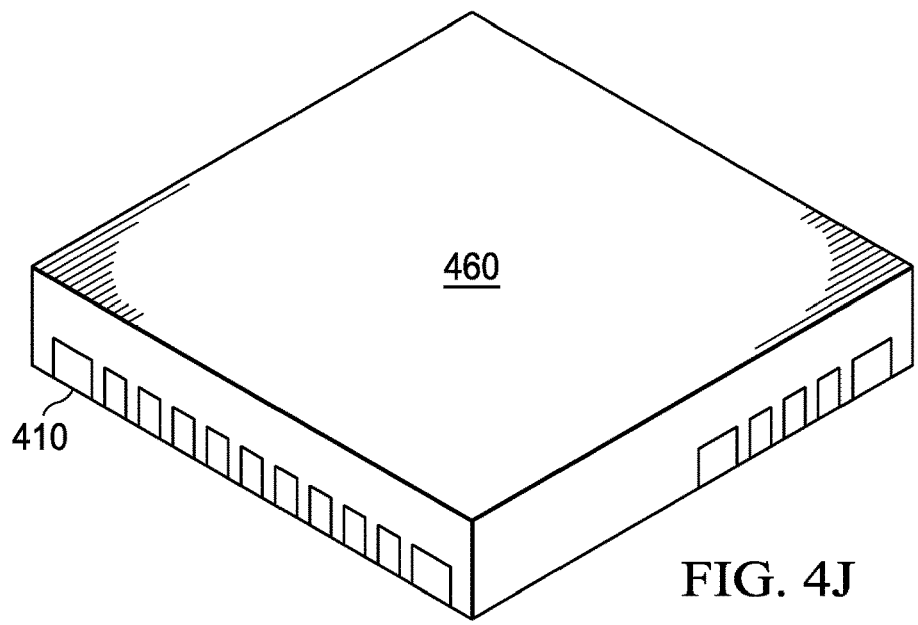
FIG. 4J is a projection view of a quad., flat, no lead (QFN) packaged electronic device including a die.

FIG. 4J is a projection view of a commercially manufactured quad. flat no-lead (QFN) packaged electronic device 460. Partially exposed lead frame leads 410 form terminals on the base of the QFN 460 that can be soldered to leads on a substrate such as the printed circuit board in an electrical system.

Figure 6B:
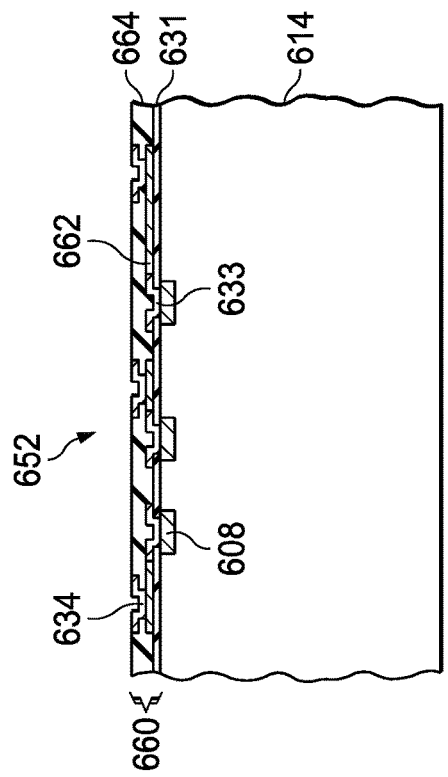
FIGS. 6A-6D are cross sections illustrating the major steps to form wafer level chip-scale packaged (WCSP) dies wherein the WCSP dies have thick, metal on a roughened backside surface to form a low resistance contact.

FIGS. 6A-6D illustrate in a series of cross sectional views wafer level chip-scale packaging (WCSP) of semiconductor devices with low resistance backside contact. FIGS. 6E and 6F illustrate in a projection view a semiconductor wafer in a WCSP process and an example semiconductor device die in close up view from the semiconductor wafer. FIG. 6G illustrates in a cross sectional view a WCSP semiconductor device die of the arrangements mounted to a board or substrate.

In FIGS. 6A-6G similar reference labels are used for similar elements as are shown in FIG. 2A-2H for clarity. For example, substrate 614 in FIGS. 6A-6D corresponds to substrate 214 in FIGS. 2A-2H. Descriptions of the major steps in FIGS. 6A-6G are listed in the process flow diagram in FIG. 7. In the WCSP process, certain packaging steps are performed at the wafer level prior to die singulation, and the singulated WCSP dies are then mounted on a system circuit board or substrate without additional processing.

Figure 6A:
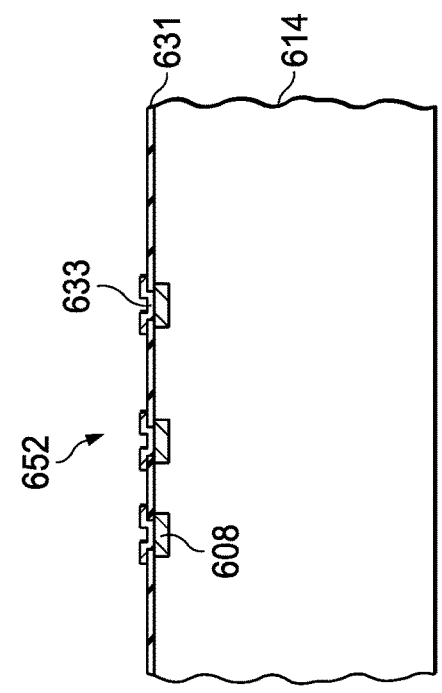
Figure 6D:
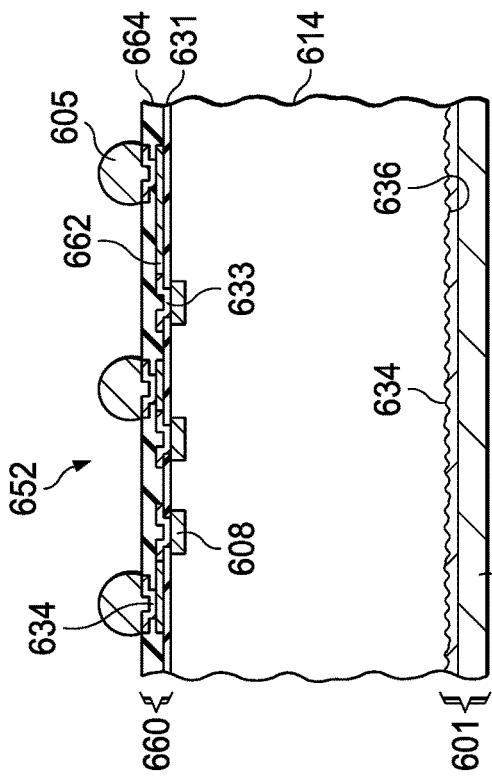

FIG. 6A illustrates in a cross sectional view an example semiconductor device die 652 shown on a WCSP substrate 614. Bond pads 608 on the active device surface of the example die 652 that is part of substrate 614 are shown with a under bump metal (UBM) 633 formed on a passivation or protective overcoat dielectric layer 631. The UBM 633 is formed in openings in the dielectric layer 631 and in electrical contact with bond pads 608 (see step 700 in FIG. 7). In an example arrangement, solder bumps or conductive columns with solder tips can be formed on UBM 633 in FIG. 6A. However, in the particular example of FIGS. 6A-6G, an additional redistribution layer 660 is formed over the bond pads 608 as is described hereinbelow.

In FIG. 6B (see optional step 701, FIG. 7) a redistribution layer 660 is optionally formed on the die 652 of the WCSP wafer 614. The redistribution layer 660 can be used to relocate solder balls 605 from positions of the bond pads 608 on the WCSP dies 652 to conductive land locations compatible with leads (see 668, FIG. 6G) on the substrate 670 on which the WCSP dies 652 will be mounted. In FIG. 6B, redistribution layer 660 includes the passivation layer 631, conductive traces 662 that provide conductive paths to map the bond pad locations 608 to solder bump locations for the finished device. In FIG. 6B, an additional dielectric or passivation layer 664, and UBM layer 634 that is patterned to provide solder bump 605 locations on the surface of passivation 664 is formed (see step 703, FIG. 7).

Figure 3:
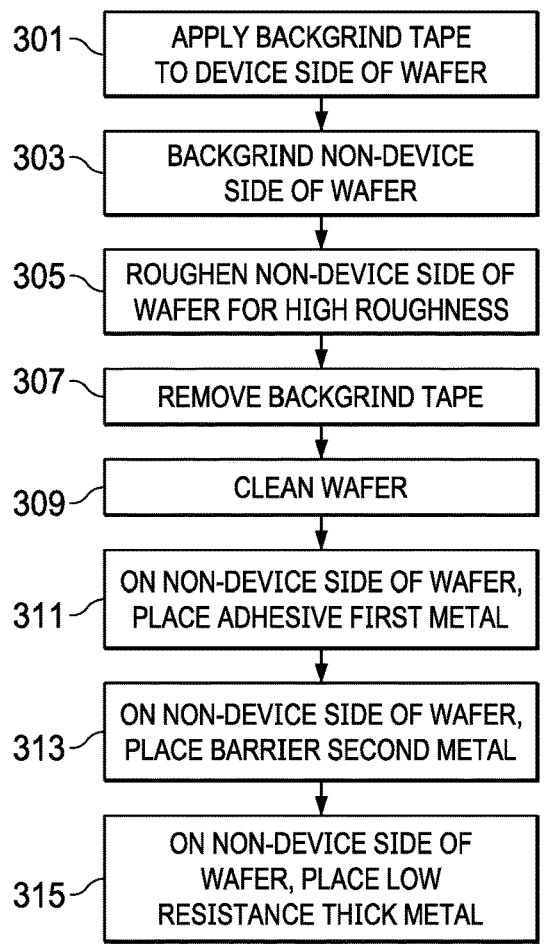
FIG. 3 is a flow diagram with descriptions of the manufacturing steps in FIGS. 2A-2H.
Figure 6C:
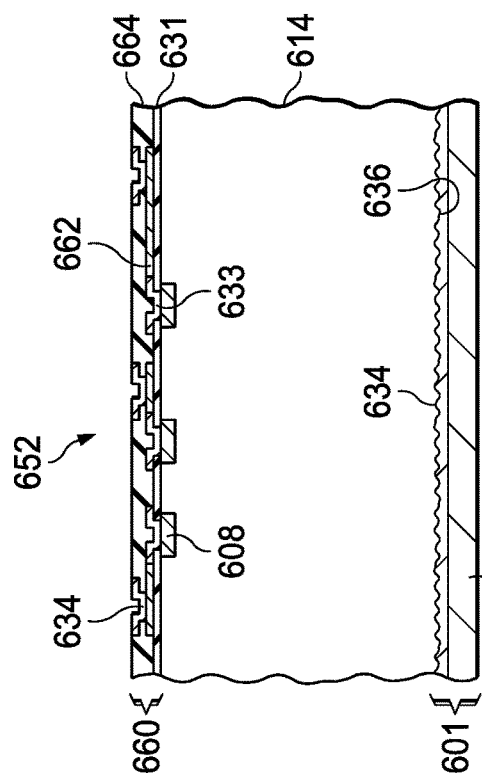
Figure 6E:
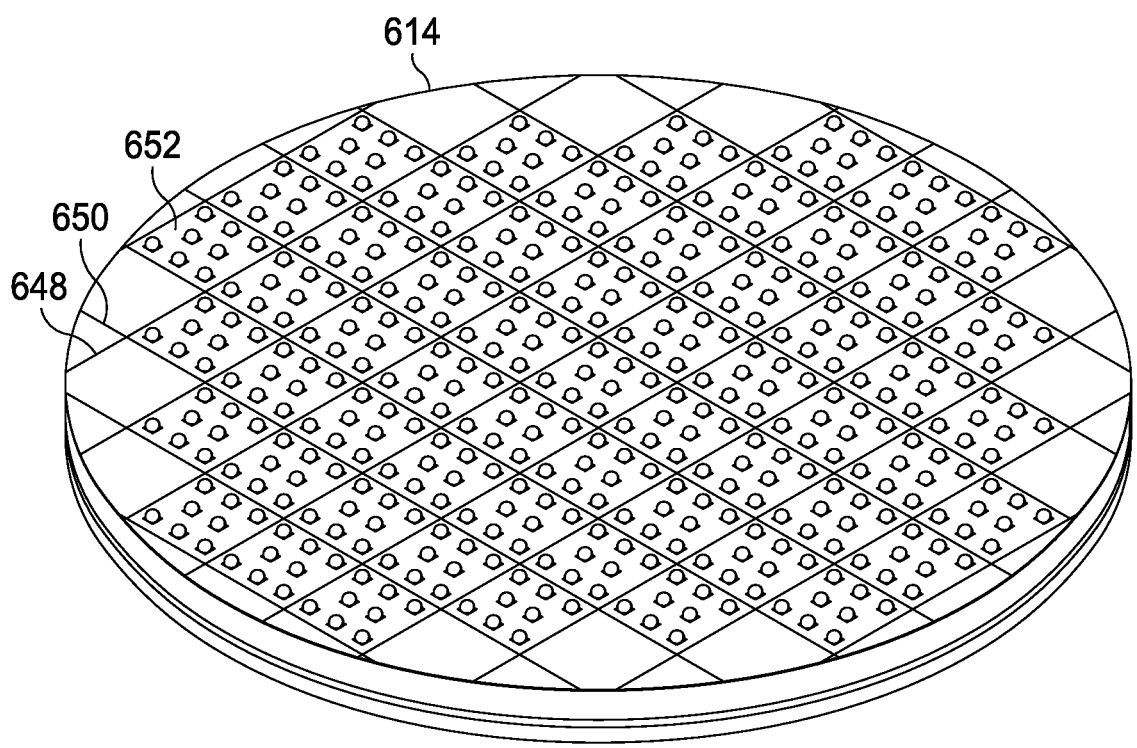
FIGS. 6E-6F are projection views of a WCSP wafer and a close up view of a WCSP semiconductor device die.
Figure 6F:
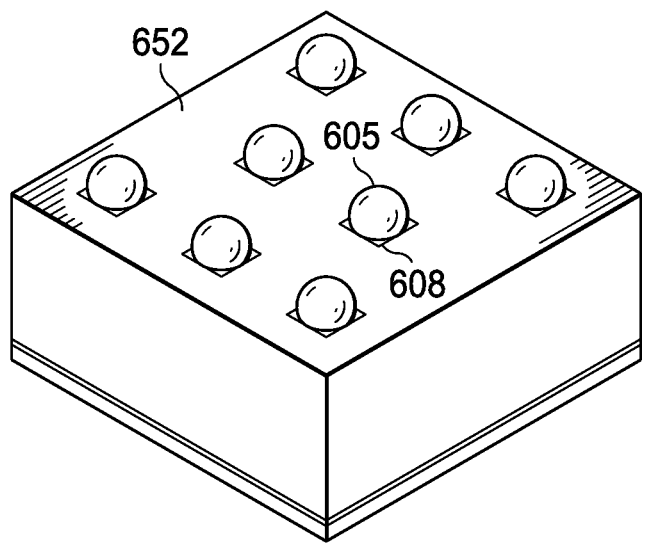
Figure 6G:
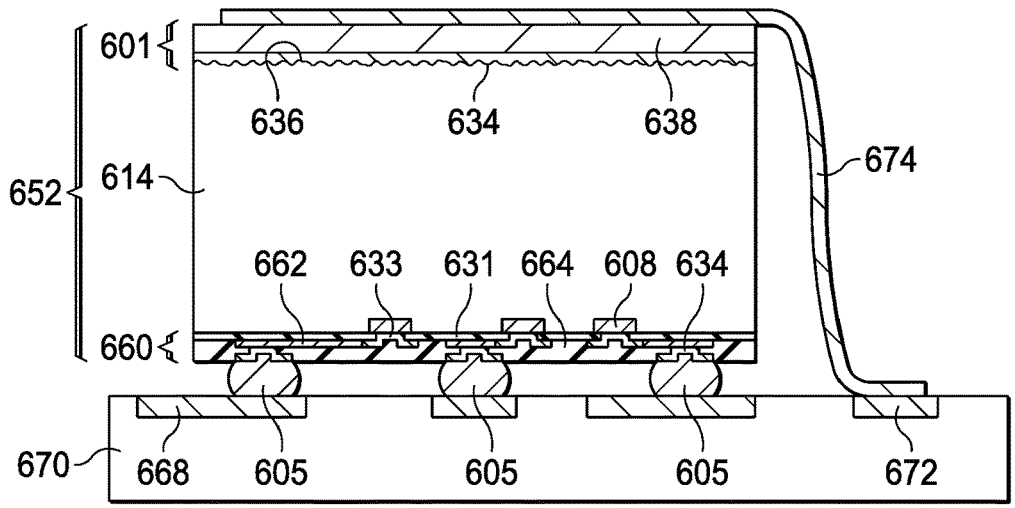
FIG. 6G is a cross sectional view of a die with a roughened backside surface and a thick metal layer over the backside surface mounted to a system board.
Figure 7:
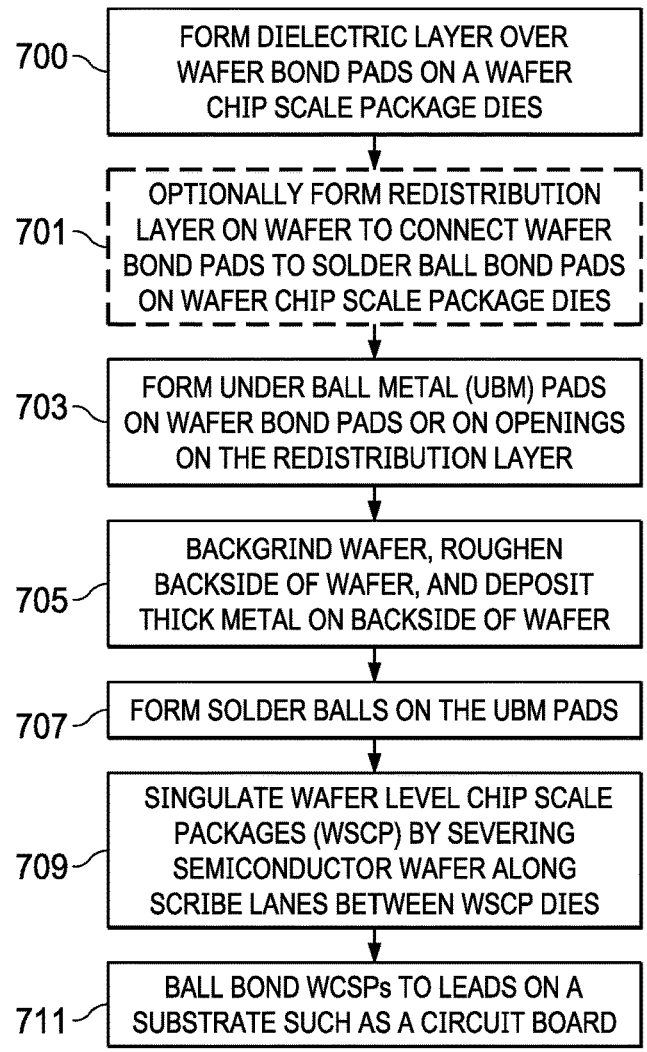
FIG. 7 is a flow diagram with descriptions of the manufacturing steps shown in FIGS. 6A-6G.

FIG. 6C illustrates in a cross sectional view the die 652 on WCSP wafer 614 after the steps shown in step 705, FIG. 7 (and described in FIGS. 2A-2H and flow diagram in FIG. 3). The WCSP wafer 614 is background, the resulting smooth backside surface is roughened by an etch, and a thick, low resistance backside metal stack 601 is deposited. The backside metal stack 601 can be a metal adhesion layer 634, a metal barrier layer 636, and a thick metal layer 638 as described hereinabove. In an example the adhesion layer includes titanium, the barrier layer includes nickel, and the thick metal layer includes silver and the layer thickness is at least 1.5 μms thick and up to 5.5 μms. The backside metal 601 provides a low resistance path between a substrate or circuit board the die 652 will be mounted to (not shown) and a device formed in the semiconductor device die 652, for example, to a drain or source of a transistor. In the arrangements, the use of the roughened surface of substrate 614 prevents or reduces the delamination of the backside metal layer 601.

FIG. 6D illustrates the die 652 on the WCSP wafer 614 after a solder bumping process (see step 707 in FIG. 7). In FIG. 6D, solder balls 605 are formed on the UBM layer 634 to form the terminals for the semiconductor device die 652. The backside layer 601 is shown with the roughened backside of the WCSP wafer 614 and the layers 634, 636 and 638 over the WCSP wafer.

FIG. 6E is a projection view of the WCSP wafer 614 with the active surface of the dies 652 shown separated from one another by scribe lanes 648 (oriented horizontally in the figure) and 650 (oriented vertically in the figure).

FIG. 6F shows an expanded view of one of the WCSP dies 652 after it is singulated or diced (by cutting through the WCSP wafer 614 along scribe lanes 648 and 650 that run between adjacent WCSP dies 652, see FIG. 6E and step 709 in FIG. 7).

In FIG. 6G, a cross sectional view illustrates a singulated WCSP die 652 with the low resistance backside metal 638 that is flip-chip mounted on leads 668, 672 on a substrate 670 such as a printed circuit board PCB. (Note that the optional redistribution layer 660 of FIGS. 6A-6D is not shown in FIG. 6G for simplicity of illustration, but can also be used with this arrangement.) The solder balls 605 are shown melted by a thermal reflow process to form solder joints between the WCSP die 652 and the substrate lands 668, the solder joints provide electrical connection and mechanical connection between the substrate 670 and the WCSP die 652. A conductor 674 couples the backside of the die 652 to a land 672. A conductor 674 can be a wire or ribbon to provide an electrical pathway between the thick backside metal 638 and a substrate land 672 on the substrate 670. To further reduce the resistance between the backside of die 652 and the substrate 670, additional wire bonds 674 and additional lands 672 can be used. A protective coating of epoxy or resin can be applied over the die 652 and the bond wire 674 (not shown).

Modifications are possible in the described arrangements, and other alternative arrangements are possible within the scope of the claims.

What is claimed is:

1. An electrical apparatus, comprising:
a metal layer with a thickness between 1.5 μms and 5.5 μms formed over a non-device side of a semiconductor device die on a semiconductor substrate, the semiconductor device die having devices formed on a device side of the semiconductor device die opposite the non-device side;
a first side of the metal layer bonded to a die mount pad on a package substrate;
a second side of the metal layer formed over a roughened surface on the non-device side of the semiconductor device die, the roughened surface having an average surface roughness (Ra) between 40 nm and 500 nm;
bond pads on the semiconductor device die electrically coupled to conductive leads on the package substrate; and
mold compound covering at least a portion of the semiconductor device die and at least a portion of the conductive leads.

2. The electrical apparatus of claim 1, wherein the semiconductor device die includes a MOS transistor.

3. The electrical apparatus of claim 1, wherein the semiconductor device die includes a bipolar transistor.

4. The electrical apparatus of claim 1, further comprising an adhesion layer between the roughened surface and the metal layer.

5. The electrical apparatus of claim 4, wherein the adhesion layer comprises titanium.

6. The electrical apparatus of claim 1, further comprising an adhesion layer and a barrier layer stack between the roughened surface and the metal layer.

7. The electrical apparatus of claim 6, wherein the adhesion layer comprises titanium and the barrier layer comprises nickel.

8. The electrical apparatus of claim 1, further comprising:
a titanium adhesion layer on the roughened surface with a thickness between 180 nm and 220 nm;
a nickel barrier layer with a thickness between 180 nm and 400 nm over the titanium adhesion layer; and
the metal layer comprising silver over the nickel barrier layer.

9. A method, comprising:
backgrinding a non-device side of a single crystal silicon wafer (wafer);
spin-etching the non-device side of the wafer to produce a roughened surface with a Ra between 40 nm and 500 nm; and
depositing a metal with a thickness between about 1.5 μm and 5.5 μm over the roughened surface.

10. The method of claim 9, wherein spin-etching the non-device side further comprises:
mounting the wafer on a support with the non-device side of the wafer exposed;
ramping a spin speed to between 300 rpm and 600 rpm;
dispensing a first liquid mixture containing 75% to 85% sulfuric acid, 5% to 10% nitric acid, and 0.8% to 5% hydrofluoric acid and distilled water for at least 10 seconds;
dispensing a second liquid mixture containing 65% to 70% nitric acid, 0.5% to 1% hydrofluoric acid and hydrogen peroxide for at least 10 seconds; and
dispensing a third liquid mixture containing 0.49% to 3% hydrofluoric acid and distilled water for at least 10 seconds.

11. The method of claim 10, further comprising:
a temperature of the first liquid mixture is between 30° C. and 60° C.;
temperature of the second liquid mixture is between 20° C. and 35° C.;
a temperature of the third liquid mixture is between 25° C. and 50° C.; and
a dispensing rate of the first, second, and third liquid mixtures is at least 200 ml/minute.

12. The method of claim 10, further comprising:
dispensing deionized water onto the wafer after dispensing the first liquid mixture and prior to dispensing the second liquid mixture;
dispensing deionized water onto the wafer after dispensing the second liquid mixture and prior to dispensing the third liquid mixture; and dispensing deionized water onto the wafer after dispensing the third liquid mixture.

13. The method of claim 9, wherein depositing the metal further comprises:
depositing a titanium layer with a thickness between 100 nm and 200 nm over the roughened surface;
depositing a nickel layer with a thickness between 180 nm and 400 nm over the titanium layer; and
depositing a silver layer with a thickness between 2700 nm and 5000 nm over the nickel layer.

14. A method of forming an electrical apparatus, comprising:
backgrinding a non-device side of a semiconductor wafer (wafer);
spin-etching the non-device side of the wafer to produce a roughened surface with an average roughness (Ra) greater than 150 nm;
depositing a metal with a thickness greater than about 2700 nm and less than about 5000 nm on the roughened surface;
cutting through scribe lanes between semiconductor device dies on the wafer to singulate the semiconductor device dies from the wafer;
forming an electrically conductive bond between the metal on the non-device side of the semiconductor device dies and a die mount pad on a package substrate;
forming electrical connections between bond pads on the device side of the semiconductor device dies and conducive leads on the package substrate;
covering the semiconductor device die and a portion the conductive leads with mold compound leaving portions of the conductive leads uncovered; and
sawing through saw streets on the package substrate to singulate packaged electronic device dies.

15. The method of claim 14, wherein spin-etching further comprises:
mounting the wafer to a support with the non-device side of the wafer exposed;
ramping a spin speed of the wafer to between 300 rpm and 600 rpm;
dispensing a first liquid mixture containing 75% to 85% sulfuric acid, 5% to 10% nitric acid, and 0.8% to 5% hydrofluoric acid and deionized water onto the wafer for at least 10 seconds;
dispensing a second liquid mixture onto the wafer containing 65% to 70% nitric acid, 0.5% to 1% hydrofluoric acid and hydrogen peroxide for at least 10 seconds; and
dispensing a third liquid mixture onto the wafer containing 0.49% to 3% hydrofluoric acid and deionized water for at least 10 seconds.

16. The method of claim 15, further comprising:
a temperature of the first liquid mixture is between 30° C. and 60° C.;
a temperature of the second liquid mixture is between 20° C. and 35° C.;
a temperature of the third liquid mixture is between 25° C. and 50° C.; and
a dispense rate of the first, second, and third liquid mixtures is at least 200 ml/minute.

17. The method of claim 14, wherein depositing the metal further comprises:
depositing a titanium layer with a thickness between 100 nm and 200 nm on the roughened surface;
depositing a nickel layer with a thickness between 180 nm and 400 nm on the titanium layer; and
depositing a silver layer with a thickness between 2700 nm and 5000 nm on the nickel layer.

18. A method of forming an electrical apparatus, comprising:
forming wafer level chip-scale package (WCSP) dies on a semiconductor wafer;
forming under bump metal (UBM) pads over openings in a protective overcoat (PO) layer over a device side of the semiconductor wafer, wherein the UBM pads are electrically coupled to bond pads on the device side of the semiconductor wafer;
backgrinding a non-device side of the semiconductor wafer;
spin-etching the non-device side of the semiconductor wafer to produce a roughened surface on the semiconductor wafer with an average roughness (Ra) between 40 nm and 500 nm;
depositing a metal with a thickness between about 1.5 μm and about 5.5 μm over the roughened surface;
forming solder balls on the UBM pads;
cutting through scribe lanes between WCSP dies on the semiconductor wafer to singulate the WCSP dies; and
flip-chip bonding the WCSP dies to leads on a package substrate.

19. The method of claim 18, further comprising:
prior to forming the UBM pads, forming a redistribution layer (RDL) over the PO on the WCSP dies where a first end of a conductive trace in the RDL layer is coupled to one of the bond pads;
depositing a second PO layer over the RDL layer; and
forming an opening in the second PO layer exposing the RDL layer.

20. The method of claim 18, wherein depositing a metal further comprises depositing a titanium layer over the roughened surface, depositing a nickel layer over the titanium layer, and depositing a silver layer over the nickel layer.

* * * * *